United States Patent [19]
Salzberg

[11] Patent Number: 5,136,256
[45] Date of Patent: Aug. 4, 1992

[54] AMPLIFIER COMBINER

[76] Inventor: Edward Salzberg, P.O. Box 2255, Orleans, Mass. 02653

[21] Appl. No.: 692,635

[22] Filed: Apr. 29, 1991

[51] Int. Cl.[5] .......................... H03F 3/60; H03F 3/68
[52] U.S. Cl. ................................ 330/53; 330/124 R; 330/295
[58] Field of Search ............... 330/53, 54, 124 R, 286, 330/295; 333/109, 114, 116

[56] References Cited

U.S. PATENT DOCUMENTS 4,263,559 4/1981 Ho .............................. 330/124 R X
4,743,859 5/1988 Sosin ................................ 330/54

OTHER PUBLICATIONS

Cappucci, "Combining Amplifiers? Try Serial-Feed Arrays", *Microwaves*, Oct., 1976, pp. 36, 37, 40, 41.

*Primary Examiner*—James B. Mullins
*Attorney, Agent, or Firm*—Thomas N. Tarrant

[57] ABSTRACT

A radio frequency amplifier-combiner using series fed directional couplers in an input distribution network each coupler having an amplified output to a respective coupler in an accumulator providing a high energy output with low accumulator losses. The invention can be used in waveguide with capabilities of output power levels reaching hundreds of watts and more.

11 Claims, 2 Drawing Sheets

AMPLIFIER COMBINER

BACKGROUND OF THE INVENTION

1. Field of the Invention

The invention relates to amplifier divider/combiners for dividing input rf energy between a plurality of amplifying channels and then combining the outputs to achieve high power out.

2. Description of the Prior Art

Solid state microwave amplifying devices are limited in power. To overcome this, it is a common practice to divide an input signal among a plurality of amplifiers and then combine the outputs. In the beginning, the amplifiers delivered only fractional watts, so that on combination the output might provide several watts.

Divider/combiners using distributed amplifier components in impedance networks became quite common as described in U.S. Pat. No. 4,769,618. It has been found that the amplifying devices themselves in these networks had to be extremely well matched. This is not only costly, but replacement in the field becomes virtually impossible.

U.S. Pat. No. 4,263,559 of Pang T. Ho uses directional couplers of the interdigital variety in microstrip for his power divider/combiners. These apparently have no phasing problems and probably work well at low power levels. Unlike impedance combiner networks, directional couplers are quite tractable to mismatch in the amplifiers.

Unfortunately, when high power levels are required, microstrip couplers are not adequate and the available couplers for the higher power levels produce a new series of problems. Many are difficult to package in any compact manner. Most have limitations on the range of coupling level (tightness or loosenes) available and phase through the couplers often is a function of coupling level.

SUMMARY OF THE INVENTION

In the present invention, a divider/combiner amplifier, using directional couplers whose electrical phase is a function of coupling level, has a series feed distribution with n 4-port dividing couplers, n amplifier stages each having a phase shifter and a solid state amplifier, each amplifier stage connected to a respective one of said dividing couplers, and n−1 4-port combining couplers connected to respective amplifier stages with the first and second amplifier stages connected to first and second ports respectively of the first combining coupler, all connected and phased so that the electrical length from the first dividing coupler through the first amplifier stage to the first combining coupler equals the electrical length from the first dividing coupler through the second amplifier stage to the first combining coupler, the electrical length from the first dividing coupler through the first amplifier stage to the second combining coupler equals the electrical length from the first dividing coupler through the third amplifier stage to the second combining coupler, etc. ending with the electrical length from the first dividing coupler through the first amplifier stage to the nth-1 combining coupler equaling the electrical length from the first dividing coupler through the nth amplifier stage to the nth-1 combining coupler.

Thus it is an object of the invention to provide an amplifier combiner using high energy capacity directional couplers. It is a further object of the invention to provide an amplifier combiner capable of using high energy capacity directional couplers of various configurations suited to particular packaging requirements. Further features and objects of the invention will become apparent upon reading the following description together with the drawing.

DESCRIPTION OF THE PREFERRED EMBODIMENTS OF THE INVENTION

The present traveling wave amplifier-combiner can be adapted to electromagnetic wave energy over a range far exceeding the accepted microwave range. Development work has been in the microwave region and the following description is primarily in terms of microwave technology.

Figure 1:
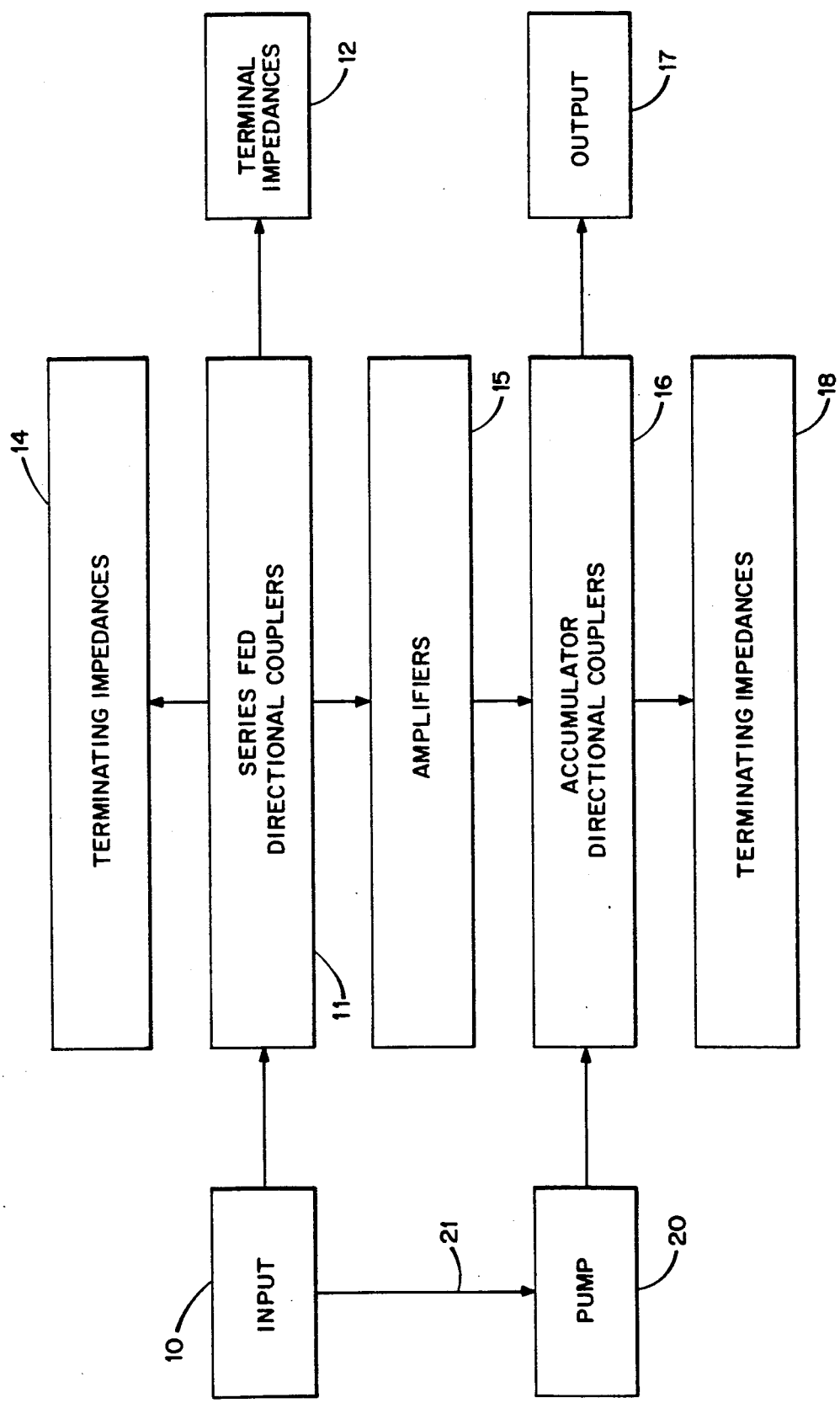
FIG. 1 is a functional block diagram of the invention.

FIG. 1 is a general functional diagram. Input 10 represents an input connector for an electromagnetic wave signal. Series fed directional couplers 11 is a plurality of directional couplers such as cross guide quadrature couplers. The first coupler has an input connection to input 10, the last coupler has a connection to terminal impedance 12, also each coupler has a connection to one impedancene of terminating impedances 14, and a connection to a respective one of amplifiers 15.

The output of each of amplifiers 15 is connected to a respective coupler in combining directional couplers 16. The last coupler in combining directional couplers 16 provides a connection to output 17. Each of the couplers in couplers 16 is connected to a respective on of terminating impedances 18.

Pump 20 may be included to provide direct energy to an additional input of the first coupler of couplers 16. By providing this "pump" input at a terminal that would otherwise have a passive termination, it becomes possible to transfer most of the power at the first coupler to the second coupler of couplers 16. Pump 20 may be another amplifier taking its input directly from input 10 or it may be a separate energy source with a synchronizing input from input 10. The pump energy must be coherent with the energy from amplifiers 15. Accordingly connection 21 from input 10 to pump 20 may be either a signal to be amplified or a synchronizing signal.

Figure 2:
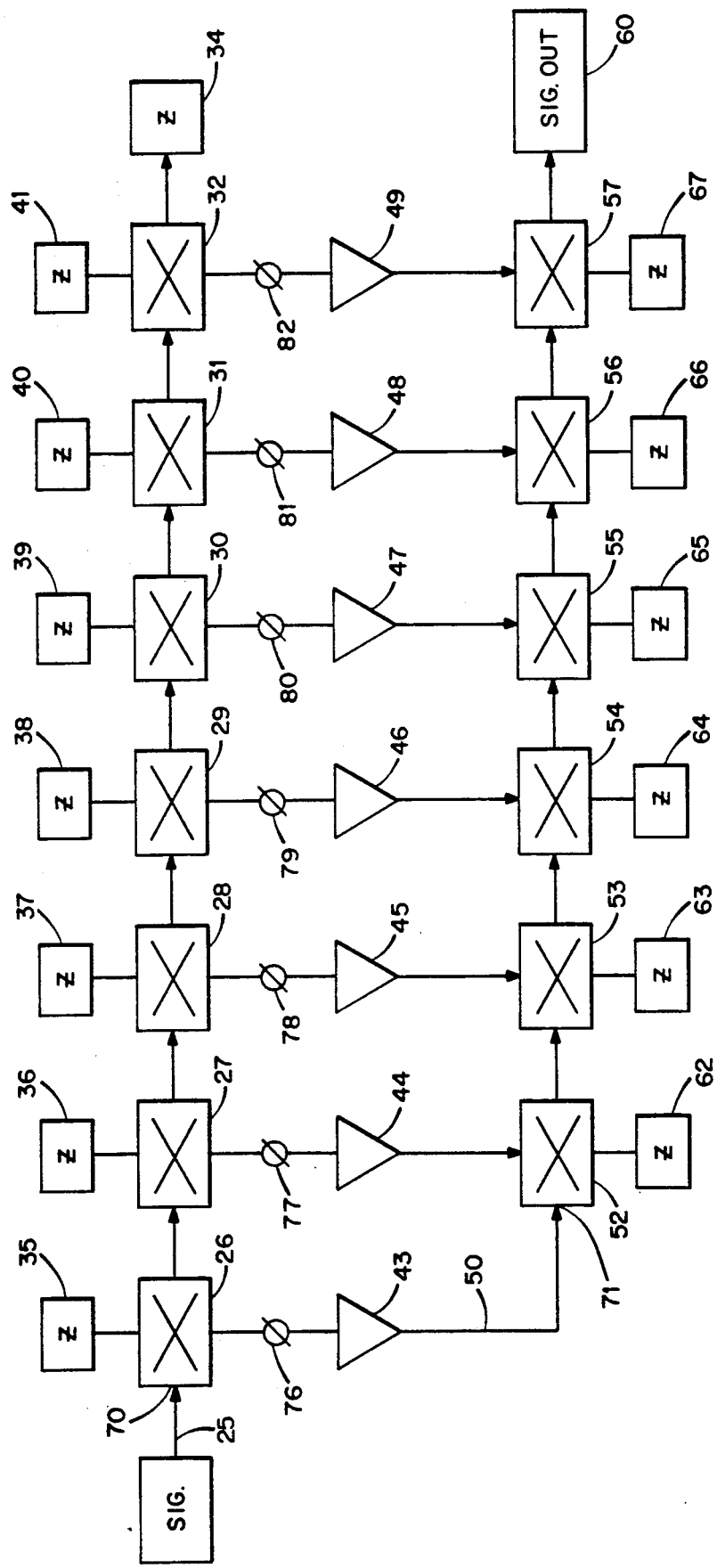
FIG. 2 is a diagrammatic illustration of a preferred embodiment of the invention.

FIG. 2 is a more specific embodiment using crossed guide couplers. For compact practical designs of an amplifier/combiner of the present type, crossed guide couplers are desirable since they can be nested tightly adjacent each other. Crossed guide couplers have a tightness of coupling that is easily varied by the coupling elements. In waveguide, a crossed guide coupler is two pieces of waveguide positoned in contact and perpendicular to each other. They are coupled at the contact area and the coupling elements can vary from circular apertures to longitudinal slots. The tightness of coupling can be varied by changing the parameters of the apertures or slots. Where a signal passes in series from one coupler to another, the ports are herein defined as "in-line" ports. Ports in the perpendicular section of the coupler are herein defined as "cross-line" ports.

For efficient operation of the amplifiers, each amplifier preferably receives the same amount of input signal. With the series feed distribution of the invention, this equal input is provided by starting with a loosely coupled crossed guide coupler and progressively tightening the coupling for each successive coupler.

Thus, in FIG. 2 signal in connection 25 is connected to the in-line input of crossed guide coupler 26, the in-line output of which is connected to the in-line input of crossed guide coupler 27 and continuing in series through crossed guide couplers 28 through 32. The in-line output of coupler 32 is connected to terminating impedance 34. One of the two cross-line ports of each of couplers 26 through 32 is connected to a respective terminating impedance 35 through 41 while the other port is connected through phase shifters 76 through 82 respectively to the input of a respective one of amplifiers 43 through 49.

Output 50 of amplifier 43 is connected to in-line input 71 of crossed guide coupler 52. The in-line connections of couplers 52 through 57 are connected in series ending with coupler 57 providing output signal connection 60. The cross-line ports of couplers 52 through 57 are connected respectively to the output of amplifiers 44 through 49 and terminating impedances 62 through 67. By correct phasing at the combiner couplers and selection of coupling tightness at each coupler, combiner efficiencies over 95% have been obtained.

For correct phasing in the embodiment of FIG. 2, the electrical lengths at the design frequency should have the following relationships:

The path from input connection 70 through amplifier 43 to coupler 52 equals the path from input connection 70 through coupler 27 and amplifier 44 to coupler 52;

The path from input connection 70 through amplifier 43 and coupler 52 to coupler 53 equals the path from input connection 70 through coupler 27, coupler 28 and amplifier 45 to coupler 53;

Corresponding equalities should continue ending with the path from input connection 70 through amplifier 43, coupler 52 and the following combiner couplers to coupler 57 equaling the path from input connection 70 through coupler 27 and the following input divider couplers, through amplifier 49 to coupler 57. These relationships are necessary to maintain phase addition.

There are two other parameter categories significant to the inventive device. One is the energy distribution in the series input. Each of amplifiers 43 through 49 preferably have the same input energy level. In order to provide this, the first of couplers 26 through 32 should have a loose coupling with sequentially increasing coupling tightness. For present day crossed guide couplers, the maximum practical tightness in production couplers is 7 dB.

While FIG. 2 shows a pump 43 and six parallel stages feeding the combiners, it must be understood that the number of stages is unlimited. Recombination losses due to nonoptimum coupling in the first stages becomes insignificant as stages are added. Amplifier combiners with 32 stages and more are contemplated.

In operation, a signal entering at 25 is divided into 7 separate but equal amplitude outputs. These 7 output signals have a phase progression that is determined by the velocity in the waveguide and by the phase shift through each of the couplers. To a lesser extend the phase if affected by the reflection from each coupler.

Some of the signal entering coupler 26 is directed to phase shifter 76 and then on to amplifier 43. The output of amplifier 43 feeds the main line of coupler 52. Coupler 27 and amplifier 44 act together to feed a signal into the upper cross-line port of coupler 52. The two signals, if properly phased, will tend to combine in the main line (in-line) of the accumulator and will tend to cancel in the load arm to 62. The ratio of these two signals along with the output ratio of coupler 52 determines the degree of cancellation at termination 62.

As the energy progresses through the combiners, each successive stage adds to the power in the main line. The power accumulates at each step until at the end of the line, 60, there is the summation of all the amplifier outputs minus the recombination loss, minus resistive loss and minus reflection loss. Recombination loss is defined herein as the sum of energy entering terminations 62 through 67.

While the drawing shows an amplifier combiner with 7 amplifying paths, the following tables give exemplary figures for an amplifier combiner with 32 amplifying paths.

Table I lists the 32 dividing couplers in their series sequence beginning with the one connected to the rf signal source. Thus the first coupler is a 15.9 dB coupler. The distribution in dB is the power to the respective amplifier stages. Thus the coupling in dB is selected so that the distribution in dB is uniform.

The third column in Table I shows phase shift of the couplers in degrees. While the first two colums can apply to many couplers, the third column was calculated based on cross guide couplers. It is the phase shift that occurs through the coupler and not the phase shift between the output ports. It shows that the phase through the coupler changes depending on the coupling in dB.

Table II lists the 31 combining couplers in their series sequence beginning with the coupler connected to the first two amplifier stages and listed as stage 2 in the table.

The first 5 couplers are all listed as 8 dB couplers. The reason for this is that tighter coupling makes the couplers narrow band and undesirably frequency sensitive. In the table, AU is used to mean "Amplifier Units" designating the energy from each amplifier stage as one AU. It will be seen that the recombination loss at the first combining coupler is 0.27 AU. As the in-line power along the accumulator builds, the recombination loss reduces to zero after the fifth coupler.

The Power Accumulation column shows improvement after the fifth coupler, but resistive and reflective losses prevent a perfect one AU accumulation at each stage.

The column on phase shift again applies specifically to cross guide couplers and is similar to the phase shift in Table I.

The Power Distribution column shows that the accumulator cannot be interchanged with the distributor. Their characteristics are not equivalent.

Table III shows the phase corrections required in each channel using cross guide couplers. It demonstrates that substantial phase correction is essential using couplers whose phase through the coupler changes with coupling level.

Table IV shows the efficiency rating. If the efficiency were 100% the output would be 32 AU, the entire output of all the amplifier stages accumulated at the output of the accumulator.

While the undesired recombination losses distract development engineers from using this kind of approach, the table shows that the recombination losses are actually minor.

TABLE I

| STAGE NUMBER | DISTRIBUTOR COUPLING in dB | DISTRIBUTION in dB | PHASE SHIFT OF COUPLERS in degrees |
|---|---|---|---|
| 1 | 15.9 | 15.9 | 9.22 |
| 2 | 15.779 | 15.90 | 9.36 |
| 3 | 15.653 | 15.90 | 9.49 |
| 4 | 15.523 | 15.90 | 9.64 |
| 5 | 15.389 | 15.90 | 9.79 |
| 6 | 15.252 | 15.90 | 9.95 |
| 7 | 15.110 | 15.90 | 10.11 |
| 8 | 14.965 | 15.90 | 10.29 |
| 9 | 14.814 | 15.90 | 10.47 |
| 10 | 14.658 | 15.90 | 10.66 |
| 11 | 14.497 | 15.90 | 10.86 |
| 12 | 14.330 | 15.90 | 11.07 |
| 13 | 14.157 | 15.90 | 11.30 |
| 14 | 13.977 | 15.90 | 11.54 |
| 15 | 13.789 | 15.90 | 11.80 |
| 16 | 13.594 | 15.90 | 12.07 |
| 17 | 13.390 | 15.90 | 12.36 |
| 18 | 13.176 | 15.90 | 12.64 |
| 19 | 12.952 | 15.90 | 13.01 |
| 20 | 12.716 | 15.90 | 13.37 |
| 21 | 12.467 | 15.90 | 13.77 |
| 22 | 12.204 | 15.90 | 14.20 |
| 23 | 11.924 | 15.90 | 14.68 |
| 24 | 11.626 | 15.90 | 15.20 |
| 25 | 11.307 | 15.90 | 15.79 |
| 26 | 10.963 | 15.90 | 16.44 |
| 27 | 10.590 | 15.90 | 17.19 |
| 28 | 10.184 | 15.90 | 18.04 |
| 29 | 9.736 | 15.90 | 19.03 |
| 30 | 9.238 | 15.90 | 20.20 |
| 31 | 8.677 | 15.90 | 21.61 |
| 32 | 8.034 | 15.90 | 23.36 |

NOTE: Distribution calculations are based on an assumption of .01 dB loss between couplers.

TABLE II

ACCUMULATOR CALCULATIONS

| STAGE NUMBER | COUPLING in dB | RECOMBINATION LOSS, AU (1) | POWER ACCUMULATION AU (2) | PHASE SHIFT OF COUPLERS in degrees | POWER DISTRIBUTION in dB (3) |
|---|---|---|---|---|---|
| 1 | — | .00 | 1.00 | — | 11.79 |
| 2 | 8.00 | .27 | 1.73 | 23.46 | 19.03 |
| 3 | 8.00 | .16 | 2.50 | 23.46 | 18.27 |
| 4 | 8.00 | .08 | 3.48 | 23.46 | 17.52 |
| 5 | 8.00 | .03 | 4.44 | 23.46 | 16.76 |
| 6 | 8.00 | .01 | 5.43 | 23.46 | 16.00 |
| 7 | 8.07 | .00 | 6.42 | 23.26 | 15.32 |
| 8 | 8.69 | | 7.40 | 21.57 | 15.30 |
| 9 | 9.24 | | 8.38 | 20.19 | 15.29 |
| 10 | 9.72 | | 9.36 | 19.06 | 15.27 |
| 11 | 10.15 | | 10.34 | 18.11 | 15.25 |
| 12 | 10.54 | | 11.32 | 17.29 | 15.23 |
| 13 | 10.90 | | 12.29 | 16.56 | 15.21 |
| 14 | 11.23 | | 13.27 | 15.93 | 15.19 |
| 15 | 11.53 | | 14.23 | 15.38 | 15.16 |
| 16 | 11.82 | | 15.20 | 14.86 | 15.15 |
| 17 | 12.09 | | 16.17 | 14.39 | 15.13 |
| 18 | 12.34 | | 17.13 | 13.98 | 15.11 |
| 19 | 12.58 | | 18.09 | 13.59 | 15.09 |
| 20 | 12.80 | | 19.05 | 13.24 | 15.07 |
| 21 | 13.01 | | 20.00 | 12.92 | 15.04 |
| 22 | 13.21 | | 20.96 | 12.62 | 15.02 |
| 23 | 13.41 | | 21.91 | 12.33 | 15.01 |
| 24 | 13.59 | | 22.86 | 12.07 | 14.98 |
| 25 | 13.77 | | 23.81 | 11.82 | 14.97 |
| 26 | 13.94 | | 24.75 | 11.59 | 14.95 |
| 27 | 14.10 | | 25.70 | 11.50 | 14.93 |
| 28 | 14.26 | | 26.64 | 11.17 | 14.91 |
| 29 | 14.41 | | 27.58 | 10.97 | 14.89 |
| 30 | 14.55 | | 28.51 | 10.79 | 14.87 |
| 31 | 14.83 | | 29.45 | 10.62 | 14.85 |
| 32 | 14.83 | | 30.38 | 10.45 | 14.83 |

NOTE (1)—AU stands for "amplifier units".
NOTE (2)—Power accumulation calculations are based on an assumption of .01 dB loss between couplers.
NOTE (3)—Power distribution calculations are based on feeding the load-end of the assembly (.01 dB loss between couplers).

TABLE III

PHASE CORRECTIONS REQUIRED IN EACH CHANNEL

| Stage Number | Phase in Degrees |
|---|---|
| 1 | 0 |
| 2 | 80 |
| 3 | 94 |
| 4 | 108 |
| 5 | 122 |
| 6 | 135 |
| 7 | 148 |
| 8 | 161 |
| 9 | 173 |
| 10 | 182 |
| 11 | 190 |
| 12 | 197 |
| 13 | 203 |
| 14 | 208 |
| 15 | 212 |
| 16 | 216 |
| 17 | 218 |
| 18 | 220 |
| 19 | 221 |
| 20 | 221 |
| 21 | 221 |
| 22 | 219 |

TABLE III-continued
PHASE CORRECTIONS REQUIRED IN EACH CHANNEL

| Stage Number | Phase in Degrees |
|---|---|
| 23 | 217 |
| 24 | 214 |
| 25 | 211 |
| 26 | 206 |
| 27 | 200 |
| 28 | 194 |
| 29 | 186 |
| 30 | 177 |
| 31 | 166 |
| 32 | 153 |

TABLE IV
EFFICIENCIES AND LOSSES

| | AMPLIFIER UNITS | % | dB |
|---|---|---|---|
| OUTPUT | 30.38 | 94.94 | −.226 |
| RECOMBINATION LOSS | .54 | 1.69 | −.074 |
| IR LOSS | 1.08 | 3.38 | −.149 |

While the invention has been described in terms of specific embodiments, other types of high energy couplers may be used and the phase shifters can be located other than as drawn. The requirement is that the phase shifters be capable of equalizing the electrical line lengths compensating for phase shifts in the couplers as well as any variation in physical line length. Since for any specific model, the phase shift to be corrected will be the same from unit to unit, the phase shifters do not need to be adjustable.

I claim:

1. A microwave amplifier combiner, using directional cross guide couplers whose electrical phase is a function of coupling level, comprising:
   a. an rf input source having an output connection;
   b. a series feed distributor with n 4-port directional cross guide couplers connected in series as dividing couplers beginning with a first dividing coupler, said distributor having an input connected to said output connection;
   c. n amplifier stages each having a phase shifter and a solid state amplifier connected in series, each amplifier stage beginning with a first amplifier stage connected to an output port of a respective dividing coupler, and;
   d. an accumulator comprising n-1 4-port directional cross guide couplers connected in series as combining couplers, each combining coupler having an input connection from a respective one of said amplifier stages with first and second amplifier stages connected to first and second input ports of a first combining coupler, all connected and phased so that the electrical length from the first dividing coupler through the first amplifier stage to any other combining coupler equals the electrical length from the first dividing coupler through an amplifier stage connected to the same other combining coupler to said other combining coupler, n being an arbitrary number of paths of equal power distribution.

2. A microwave amplifier combiner according to claim 1 wherein the first combining coupler is coupled too loosely to optimumly transfer the power impinging on it from the first and second amplifier stages, but where through successive stages, power accumulates until optimum transfer occurs and continues through all the following stages so that the energy finally exiting the accumulator output is the summation of all the amplifier outputs, less the power lost in a number of beginning coupler terminations and less the power losses that are indigenous to the transmission lines from the amplifier outputs to the accumulator output.

3. A microwave amplifier combiner according to claim 1 wherein said series feed distributor terminates with a 4-port directional cross guide coupler in which one in-line port is an input from the previous coupler, one cross-line port is an output to an amplifier stage and the remaining two ports are terminated with characteristic impedance of the transmission line.

4. An amplifier combiner comprising:
   a. a signal in put connection;
   b. a series input distribution comprising a first plurality of series fed directional cross guide couplers with a first coupler of said first plurality connected to said input connection and a final coupler, each coupler having at least a first output and a second output with the first output of all except the final coupler connected to the following coupler;
   c. a plurality of solid state amplifier stages with a first amplifier of said amplifier stages connected to the second output of said first coupler, each stage having an input and an output with the input connected to the second output of a respective one of said first plurality, and a phase shifter associated with each stage;
   d. an accumulator comprising a second plurality of series connected directional cross guide couplers each having an input connected to the output of a respective one of said amplifier stages; and,
   e. a signal output connection connected to an output of a final coupler of said accumulator and a terminating impedance connected to the first output of the final coupler of said input distribution.

5. An amplifier combiner according to claim 4 in which all of the directional couplers have a DB rating of at least 7 whereby the tightest coupler is not tighter than a 7 DB coupler.

6. An amplifier combiner according to claim 4 wherein a pump signal source is connected as a second input to the first of the couplers in said accumulator.

7. An amplifier combiner according to claim 4 wherein the electrical length at the design frequency from the signal input connection through the first amplifier to any coupler in said accumulator equal the electrical length from the signal input connection through the input distribution and an amplifier to the same coupler in said accumulator.

8. An amplifier combiner according to claim 4 wherein the couplers in said input distribution are designed to progress sequentially from loose to tight coupling so as to provide equal input signal level to each amplifier.

9. An amplifier combiner comprising:
   a. a signal input connection;
   b. a series input distribution comprising a first plurality of series fed directional cross guide couplers with a first coupler of said first plurality connected to said input connection and a final coupler, each coupler having at least a first output and a second output with the first output of all except the final coupler connected to a following coupler, the coupling tightness progressing from loose to tight so as to maintain the same output power at each second output;

c. a plurality of solid state amplifier stages with a first amplifier of said amplifier stages connected to the second output of said first coupler, each stage having an input and an output with the input connected to the second output of a respective one of said first plurality, and a phase shifter associated with each stage;

d. an accumulator comprising a second plurality of series connected directional cross guide couplers each having an input connected to the output of a respective one of said amplifier stages, a beginning coupler in the accumulator having a coupling tightness less than that producing 100% recombination power and each following coupler in the accumulator having the same tightness until the in-line power accumulates to a level sufficient to produce 100% recombination power after which the coupling tightness is progressively reduced to maintain substantially 100% recombination power;

e. a signal output connection connected to an output of a final coupler of said accumulator; and, f. a terminating impedance connected to the first output of the final coupler of said input distribution.

10. An amplifier combiner according to claim 9, wherein each of said cross guide couplers has a db rating of at least 7 db.

11. An amplifier combiner according to claim 10 wherein said amplifier combiner is a microwave amplifier combiner in waveguide.

* * * * *